(12) United States Patent
Hong

(10) Patent No.: US 7,439,182 B2
(45) Date of Patent: Oct. 21, 2008

(54) SEMICONDUCTOR DEVICE AND METHOD OF FABRICATING THE SAME

(75) Inventor: Ji Ho Hong, Hwaseong-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 122 days.

(21) Appl. No.: 11/483,567

(22) Filed: Jul. 11, 2006

(65) Prior Publication Data

US 2007/0010088 A1  Jan. 11, 2007

(30) Foreign Application Priority Data

Jul. 11, 2005 (KR) .................. 10-2005-0062322

(51) Int. Cl.
*H01L 21/302* (2006.01)
*H01L 23/48* (2006.01)

(52) U.S. Cl. .................... 438/687; 438/622; 257/752; 257/762

(58) Field of Classification Search ................. 438/618, 438/622, 626, 631, 637, 638, 687; 257/750, 257/752, 762, 774
See application file for complete search history.

(56) References Cited

U.S. PATENT DOCUMENTS 7,030,021 B2 * 4/2006 Han ........................... 438/694
2005/0095854 A1 * 5/2005 Uzoh et al. ................. 438/678

\* cited by examiner

*Primary Examiner*—Kevin M Picardat
(74) *Attorney, Agent, or Firm*—Finnegan, Henderon, Farabow, Garrett & Dunner, L.L.P.

(57) ABSTRACT

A semiconductor and a method of fabricating the same are provided. The method includes: forming an insulation layer on a substrate; forming a trench by selectively etching the insulation layer; electroplating a copper layer in the trench and on the insulation layer under such conditions that a seam is formed at a top middle portion of the trench; and polishing the copper layer to form a copper metal line with the seam.

16 Claims, 5 Drawing Sheets

SEMICONDUCTOR DEVICE AND METHOD OF FABRICATING THE SAME

RELATED APPLICATION

This application is based upon and claims the benefit of priority to prior Korean Application No. 10-2005-0062322, filed on Jul. 11, 2005, the entire contents of which are incorporated by reference-herein.

BACKGROUND

1. Technical Field

The present invention relates to a semiconductor device and a method of fabricating the same.

2. Description of the Related Art

With the miniaturization of transistors, the speed and the integration of semiconductor devices constantly increase. In the meantime, however, metal lines become narrower, which increases a circuit delay, thereby prohibiting even higher speeds of the transistors.

To alleviate the problem of increased circuit delay due to miniaturization of metal lines, metal lines that use copper together with an aluminum alloy have been developed. Copper has a low resistance and a high electro-migration (EM) resistance, and the aluminum alloy can be used as a metal line material of large scale integration (LSI). However, copper is not easily etched and oxidized during processes. Thus, a damascene process is used for forming a copper metal line.

In the damascene process, a trench in which a top layer metal line is to be formed, and a via hole in which a contact plug connecting the top layer metal line to a bottom layer metal line or a substrate is to be formed, are formed in an insulation layer. Then, a metal such as copper is filled in the trench and the via hole, and planarized by a chemical mechanical polishing (CMP) process. The damascene process includes a single damascene process that separately forms a via plug and a trench, and a dual damascene process that simultaneously forms a via plug and a trench.

An electroplating method is proposed to fill the via hole and the trench with copper during the damascene process. The electroplating method forms a copper layer using an electrolyte containing a copper solute and an acid solvent.

However, when the trench or the via hole of a high aspect ratio is electro-deposited using the electroplating method, defects such as voids and seams can be formed. These defects can reduce life of the copper metal line, and thus need to be prevented. One solution is to add an additive to a plating solution, where the additive is adsorbed on each portion of a trench to control a copper electrodeposition speed. Therefore, the trench with a high aspect ratio can be formed without defects.

SUMMARY

Accordingly, there is provided a semiconductor device and a method of fabricating the same that may substantially obviate one or more problems due to limitations and disadvantages of the related art.

Embodiments consistent with the present invention provide a semiconductor device that includes seam on the top of a metal line to reduce resistance, and a method of fabricating the same.

Consistent with the present invention, a method for fabricating a semiconductor device includes forming an insulation layer on a substrate; forming a trench by selectively etching the insulation layer; electroplating a copper layer in the trench and on the insulation layer under such conditions that a seam is formed at a top middle portion of the trench; and polishing the copper layer to form a copper metal line with the seam.

Consistent with the present invention, a method of fabricating a semiconductor device, the method includes forming a first insulation layer on a substrate with a bottom metal line; selectively etching the first insulation layer to form a via hole exposing the bottom metal line; forming a via plug by filling the via hole with a conductive material; forming a second insulation layer on the first insulation layer and the via plug; selectively etching the second insulation layer to form a trench; electroplating a copper layer in the trench under such conditions that a seam is formed at a top middle portion of the trench; and polishing the copper layer to form a copper metal line with the seam.

Consistent with the present invention, a semiconductor device includes a first insulation layer with a via plug formed on a substrate; a second insulation layer with a trench formed on the first insulation layer and the via plug; and a copper metal line in the trench and having a seam in a top middle portion thereof.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the embodiments consistent with the present invention, examples of which are illustrated in the accompanying drawings. Wherever possible, the same reference numbers will be used throughout the drawings to refer to the same or like parts.

Figure 1A:
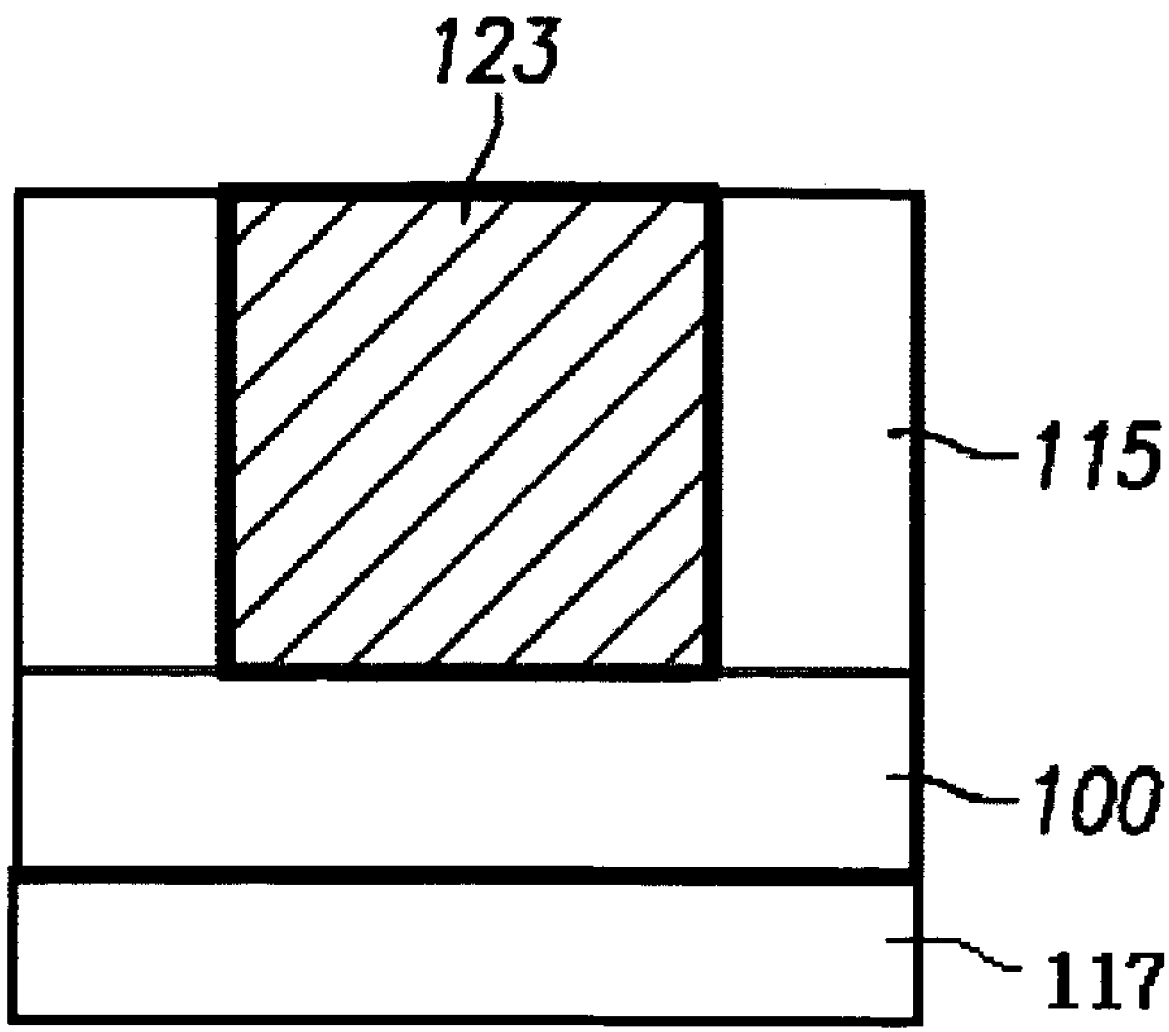
FIGS. 1A and 1B are cross-sectional views illustrating a comparison of a metal line consistent with the present invention with a conventional metal line.
Figure 1B:
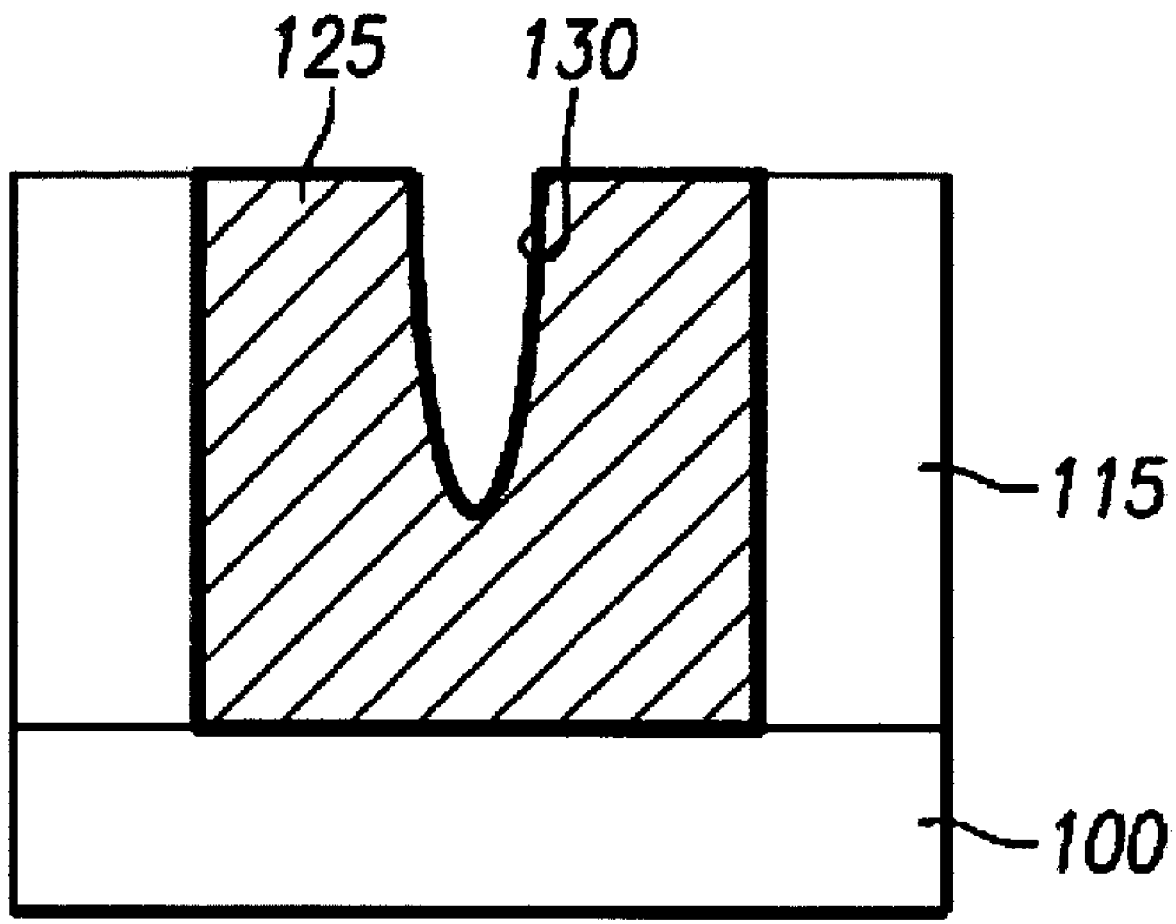

FIGS. 1A and 1B are cross-sectional views illustrating a comparison of a metal line consistent with the present invention with a conventional metal line.

Referring to FIGS. 1A and 1B, a first insulation layer 100 and a second insulation layer 115 are stacked on a substrate 117. A trench is formed in the second insulation layer 115 by selectively etching the second insulation layer 115. FIG. 1A shows a copper metal line 123 formed through conventional method, i.e., by depositing copper in the trench and planarizing the copper through a CMP process. FIG. 1B shows a copper metal line 125 formed by a method consistent with the present invention. Particularly, copper is deposited in the trench through an electroplating process and planarized.

Then, a seam 130 is formed in the metal line 125. As illustrated in FIG. 1B, when seam 130 is intentionally formed on the copper metal line 125, a surface area of the copper metal line 125 is significantly greater than that of the metal line 123 in FIG. 1A. Because electrons flow along the surface area of a metal line, the resistance of the metal line 125 is significantly lower than that of the metal line 123.

Hereinafter, processing conditions that intentionally form a seam on a copper metal line in a semiconductor will be described.

Process parameters for forming the seam in the copper metal line include concentration of an organic component such as accelerator and suppressor in electrolyte for a copper electroplating process, an initial plating current in a copper electroplating process, and a thickness and continuity of a copper seed layer. These parameters are explained in detail later.

Table 1 represents conditions for forming the copper metal line when the above process factors are applied to a 130 nm process. However, the conditions are not limited to the 130 nm process and can be applicable to other 90 nm, 180 nm, etc processes.

TABLE 1

| Parameter | Formation condition for copper seam | Non-formation condition for copper seam |
|---|---|---|
| Accelerator concentration in electrolyte | Below 4 ml/L | 4 to 8 ml/L |
| Suppressor concentration in electrolyte | Above 3 ml/L | 1 to 3 ml/L |
| Initial plating current | Below 1 Ampere | Above 1 Ampere |
| Copper seed layer thickness | Below 600 Å | 600 to 1000 Å |

First, concentration of organic components and seam formation will be described.

The concentration of accelerator and suppressor in a gap-filling initial operation of the trench is a parameter affecting the formation of a void or a seam. Electrolyte for a electroplating includes additive to improve gap-filling and uniformity characteristics. The additive can be mainly classified into an accelerator additive and a suppressor additive. The accelerator and the suppressor are combined in a predetermined ratio to be added to the electrolyte as the additive.

The suppressor relatively decreases a copper deposition speed in a pattern on which a trench with a broad width is formed. The accelerator relatively increases a copper deposition speed in a pattern on which a trench with a narrow width is formed. The accelerator and the suppressor are combined with a predetermined ratio in electrolyte to improve the gap-filling character that fills the trench having a narrow width to thereby maintain uniformity.

The accelerator increases the electroplating rate at a greater rate in a vertical direction from a bottom to a top of a via hole or a trench than in a direction perpendicular to a sidewall of a via hole or a trench. On the other hand, the suppressor serves to prevent void or seam from being formed during a gap-filling process when overhang is formed as a result of concentrated electroplating in a neck portion of the via hole and the trench due to a dense current.

When concentration of the suppressor is high or concentration of accelerator is low, the seam can be formed in the via hole or the trench by strengthening an electroplating rate of the conformal mode a low initial current.

Current as a next parameter in forming a seam will be described. The lower the initial current is, the more the electroplating in a direction perpendicular to the sidewalls of a via or trench prevails over the electroplating in a vertial direction.

Another parameter for forming a seam is a continuity of a seed layer. When the seed layer continuity is faulty, the seam or the void can occur with high possibility. When increasing a thickness of a seed layer to avoid the seam in order to improve the seed layer continuity, the seam can be prevented from being formed, but overhang increases due to the increased copper seed layer. Therefore, because the void can be gap-filled using a subsequent copper electroplating process, an appropriate thickness of the copper seed layer is below 600 Å.

Figure 2:
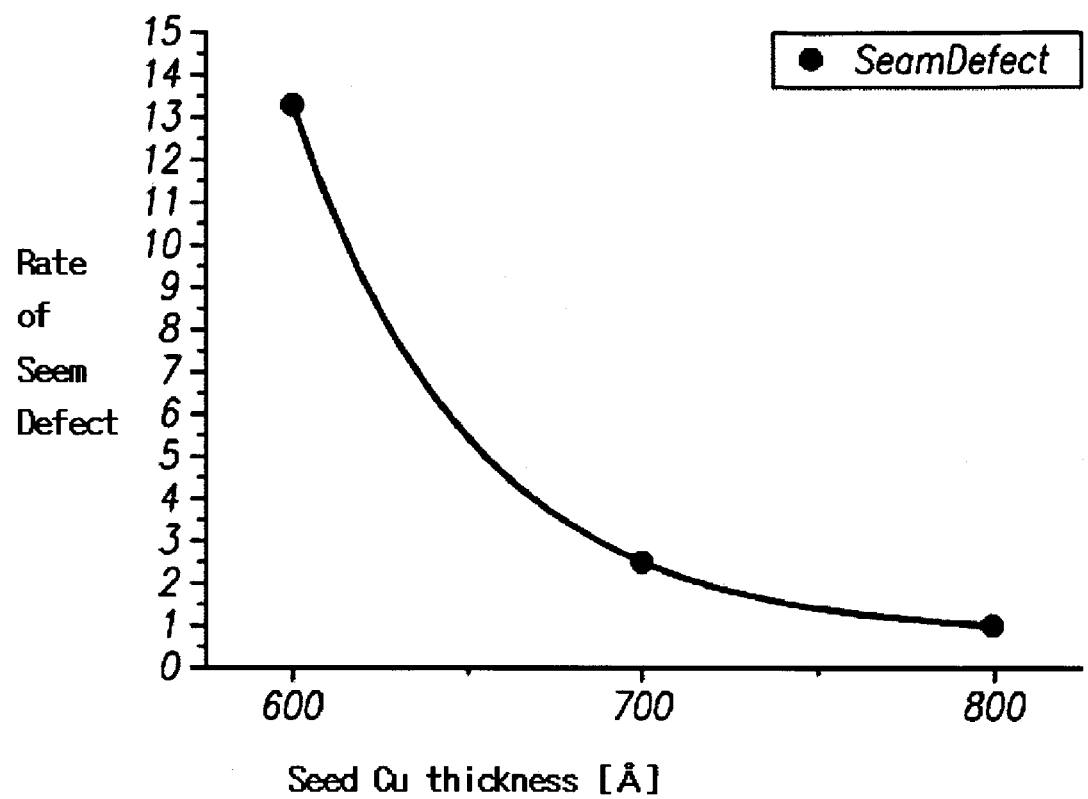
FIG. 2 is a graph illustrating the change of a rate of seam defect in a metal line with a thickness of the Cu seed layer consistent with the present invention.

FIG. 2 is a graph illustrating the change of a rate of seam defect in a metal line with a thickness of the Cu seed layer consistent with the present invention.

Referring to FIG. 2, when the thickness of the seed cu thickness is lower, the rate of seam defect is higher.

Using the processing conditions, the seam is formed on the copper metal line to reduce a copper metal line resistance.

Figure 3:
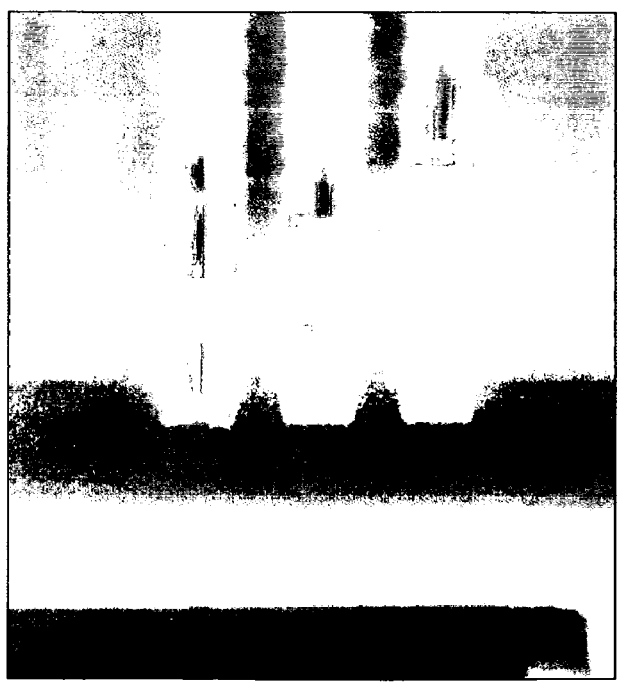
FIG. 3 is a view of seam formed in a metal line consistent with the present invention.

FIG. 3 is a view of seam formed in a metal line consistent with the present invention.

Here, a copper seam may not be formed in a via hole. A void or a seam in the via hole reduces yield. Therefore, the seam needs to be selectively formed on a copper metal line layer, by performing single damascene method to separately form a contact plug in a via hole and a copper metal line in a trench. When forming the via plug, copper is electroplated under such conditions that voids or seams are not formed; while when forming the metal line, copper is electroplated under such conditions that a seam is formed. For example, to form the via plug, an electroplating process may be performed using an electrolyte with an accelerator at a concentration over 4 ml/L, a suppressor at a concentration from 1 to 3 ml/L, or using an initial electroplating current over 1 Ampere, or a combination thereof, as Table 1 shows.

Figure 4:
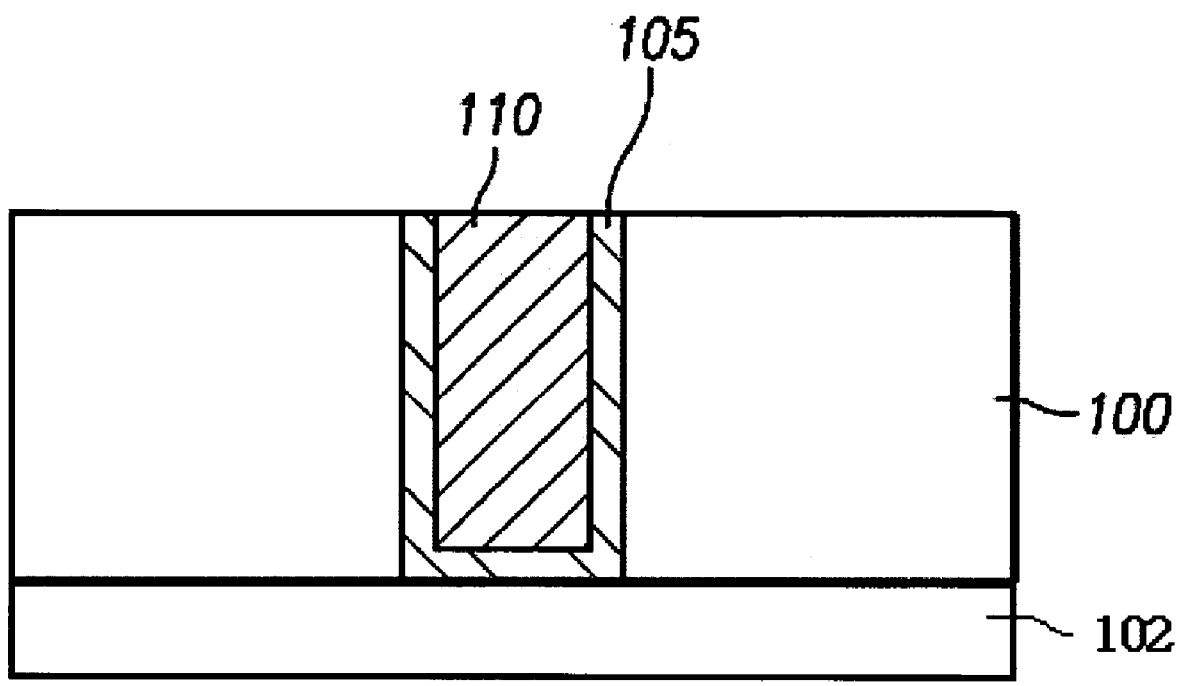
FIGS. 4 and 5 are cross-sectional views illustrating a method of fabricating a semiconductor device consistent with the present invention.
Figure 5:
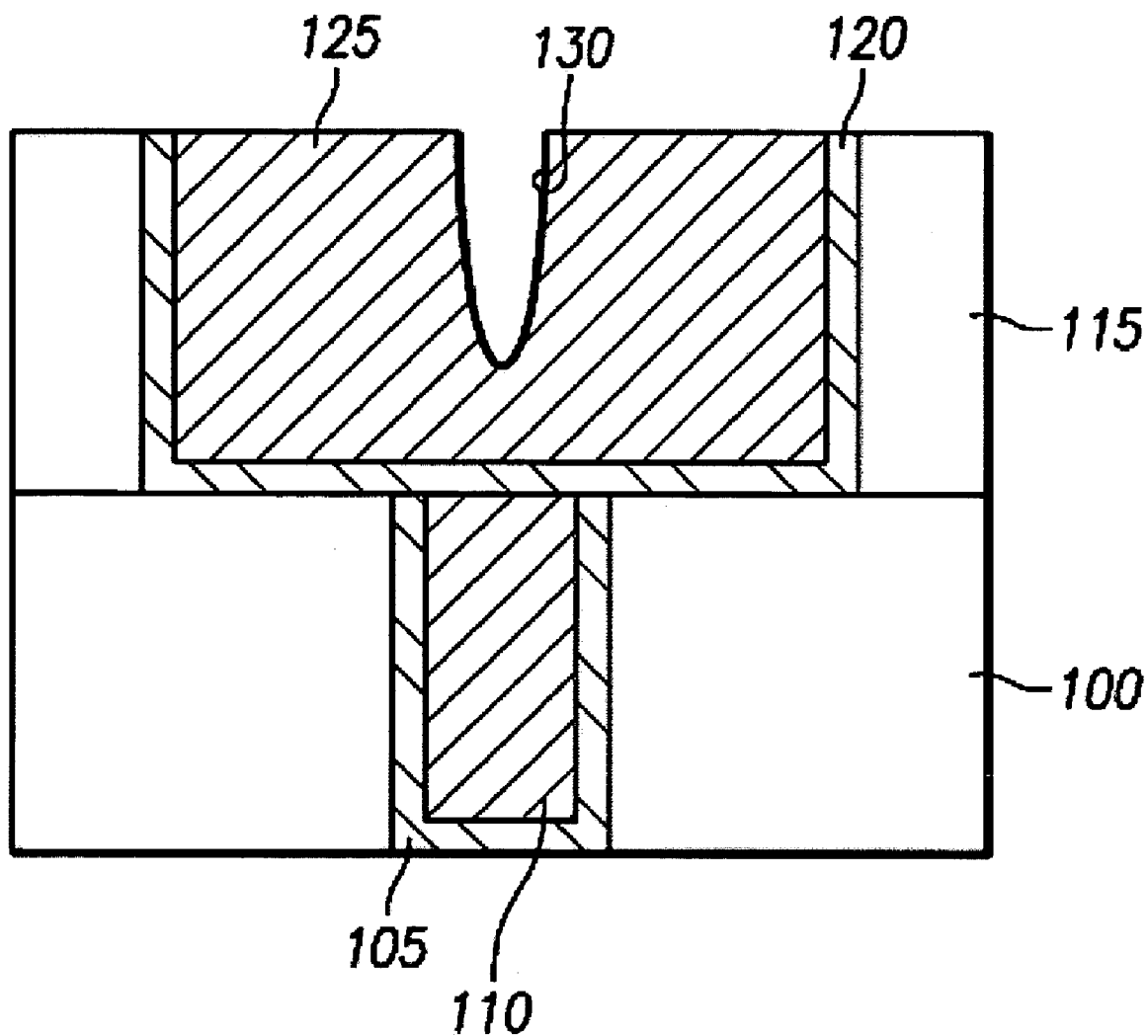

FIGS. 4 and 5 are cross-sectional views illustrating a method of fabricating a semiconductor device consistent with the present invention.

Referring to FIG. 4, a via hole exposing a bottom metal line 102 is formed in a first insulation layer 100 by selectively etching the first insulation layer 100. Then, a barrier metal layer 105 is formed in the via hole. Next, a copper layer is formed in the via hole using an electroplating method or another method, without forming a void or a seam. A via plug 110 is formed by polishing the copper layer through a CMP method until the first insulation layer 100 is exposed.

Referring to FIG. 5, a second insulation layer 115 is formed on the first insulation layer 100 and the via plug 110. The second insulation layer 115 is selectively etched to form a trench. A barrier metal layer 120 is formed in the trench. The barrier metal layer 120 can be formed of Ti, TiN, etc.

An electroplating method consistent with the present invention is performed to form a copper layer with a seam. Then, a copper metal line 125 with a seam 130 is formed by polishing the copper layer through a CMP method until the second insulation layer 115 is exposed.

When the copper metal line is formed using a single damascene method, the via plug 110 is formed without the seam, and the copper metal line 125 is formed with the seam. Therefore, a low-resistance metal line is formed, and also yield increases.

Consistent with the present invention, because the seam is intentionally formed on the top of the copper metal line, the surface area increases, and the resistance of the metal line increases.

Moreover, because the via plug is formed without the seam, and a copper metal line is formed with the seam in the trench through a single damascene method, yield increases.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor device, the method comprising:
    forming an insulation layer on a substrate;
    forming a trench by selectively etching the insulation layer;
    electroplating a copper layer in the trench and on the insulation layer under such conditions that a seam is formed at a top middle portion of the trench; and
    polishing the copper layer to form a copper metal line with the seam,
    wherein electroplating the copper layer comprises using an electrolyte with an accelerator at a concentration below 4 ml/L and a suppressor at a concentration over 3 ml/L.

2. The method according to claim 1, wherein electroplating the copper layer comprises using an initial electroplating current below 1 Ampere.

3. The method according to claim 1, wherein electroplating the copper layer comprises using a copper seed layer with a thickness below 600 Å.

4. The method according to claim 1, further comprising forming a barrier metal layer in the trench.

5. A method of fabricating a semiconductor device, the method comprising:
    forming a first insulation layer on a substrate with a bottom metal line;
    selectively etching the first insulation layer to form a via hole exposing the bottom metal line;
    forming a via plug by filling the via hole with a conductive material;
    forming a second insulation layer on the first insulation layer and the via plug;
    selectively etching the second insulation layer to form a trench;
    electroplating a copper layer in the trench under such conditions that a seam is formed at a top middle portion of the trench; and
    polishing the copper layer to form a copper metal line with the seam,
    wherein electroplating the copper layer comprises using an electrolyte with an accelerator at a concentration below 4 ml/L and a suppressor at a concentration over 3 ml/L.

6. The method according to claim 5, wherein forming the via plug comprising forming the via plug without a void or a seam.

7. The method according to claim 6, wherein forming the via plug comprises an electroplating process using an electrolyte with an accelerator at a concentration over 4 ml/L.

8. The method according to claim 6, wherein forming the via plug comprises an electroplating process using an electrolyte with a suppressor at a concentration of 1 to 3 ml/L.

9. The method according to claim 6, wherein forming the via plug comprises an electroplating process using an initial electroplating current is over 1 Ampere.

10. The method according to claim 6, wherein forming the via plug comprises using a copper seed layer with a thickness of 600 to 1000 Å.

11. The method according to claim 5, wherein electroplating the copper layer comprises using an initial electroplating current of below 1 Ampere.

12. The method according to claim 5, wherein electroplating the copper layer comprises using a copper seed layer with a thickness of below 600 Å.

13. The method according to claim 5, further comprising forming a barrier metal layer in the trench.

14. The method according to claim 5, wherein forming the via plug comprises using a single damascene process such that the seam is not formed.

15. A semiconductor device comprising:
    a first insulation layer with a via plug formed on a substrate;
    a second insulation layer with a trench formed on the first insulation layer and the via plug; and
    a copper metal line in the trench and having a seam in a top middle portion thereof,
    wherein the copper metal line is formed by electroplating a copper layer using an electrolyte with an accelerator at a concentration below 4 ml/L and a suppressor at a concentration over 3 ml/L.

16. The semiconductor device according to claim 15, wherein the via plug does not include a void or seam.

* * * * *